United States Patent [19]
Mahl

[11] 3,970,820
[45] July 20, 1976

[54] WIRE FED FLASH EVAPORATION SOURCE

[75] Inventor: Gunard O. B. Mahl, San Francisco, Calif.

[73] Assignee: CHA Industries, Menlo Park, Calif.

[22] Filed: Feb. 3, 1975

[21] Appl. No.: 546,596

[52] U.S. Cl. .................................. 219/271; 118/49; 118/49.1; 219/273
[51] Int. Cl.[2] .......................................... F22B 1/28
[58] Field of Search ................... 219/271, 273, 275; 118/48, 49, 49.1, 49.5

[56] References Cited
UNITED STATES PATENTS

| | | | |
|---|---|---|---|
| 2,664,853 | 1/1954 | Schuler | 118/49 |
| 3,058,842 | 10/1962 | Kahan et al. | 118/49 |
| 3,086,496 | 4/1963 | Strong | 118/49 |
| 3,336,154 | 8/1967 | Oberg et al. | 118/49.1 |

Primary Examiner—C. L. Albritton
Attorney, Agent, or Firm—Phillips, Moore, Weissenberger Lempio & Strabala

[57] ABSTRACT

A unique device for flash evaporating a material within a vacuum chamber. The device includes a pair of electrodes one of which is grounded and the other of which is connected to a power supply and a resistively heated boat which forms the electrical path between the two electrodes. A wire feed assembly which serves to feed wire onto the boat is supported adjacent the boat and adjacent the two electrodes. A single stream of coolant liquid is passed internally through the grounded electrode, the non-grounded electrode and the support, while each of these is maintained in electrical isolation from one another.

11 Claims, 8 Drawing Figures

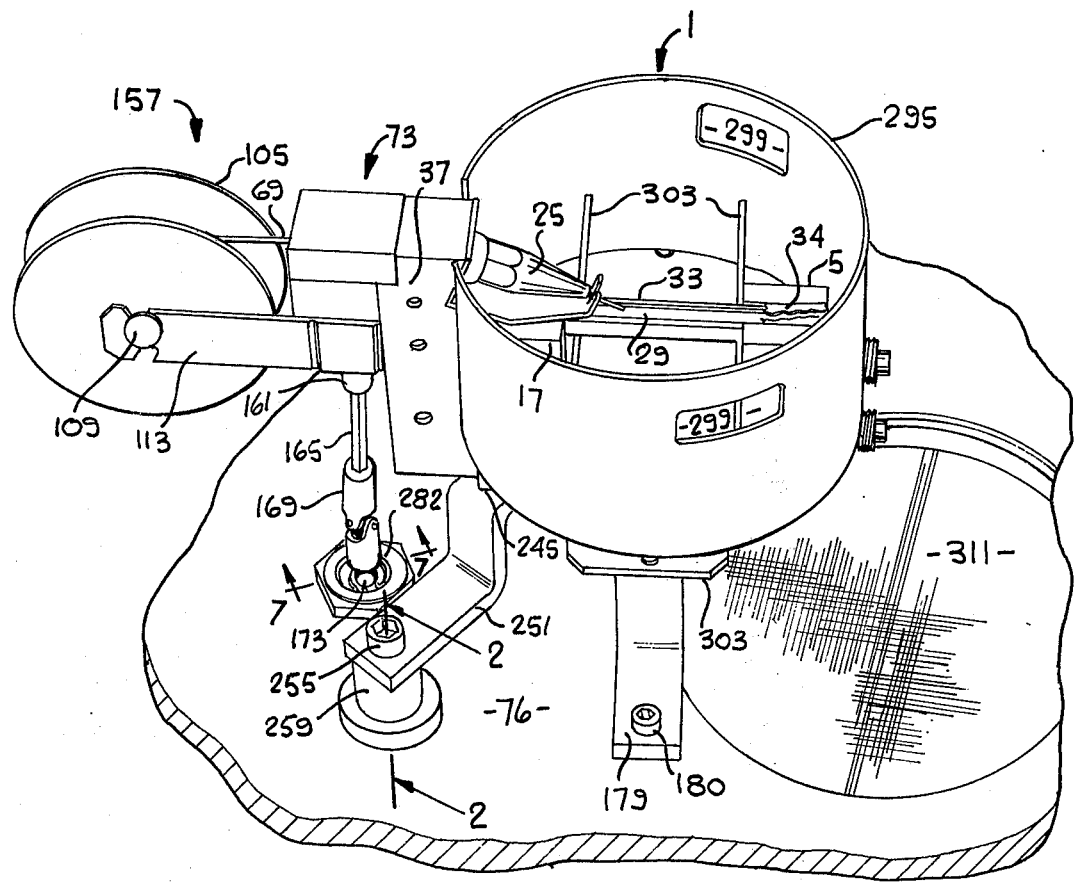
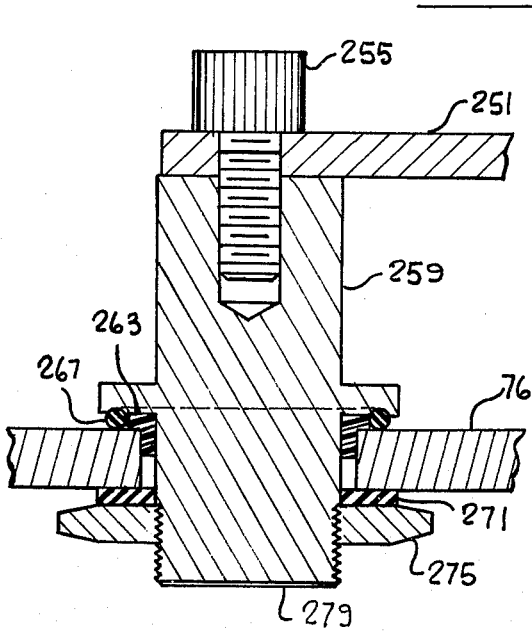
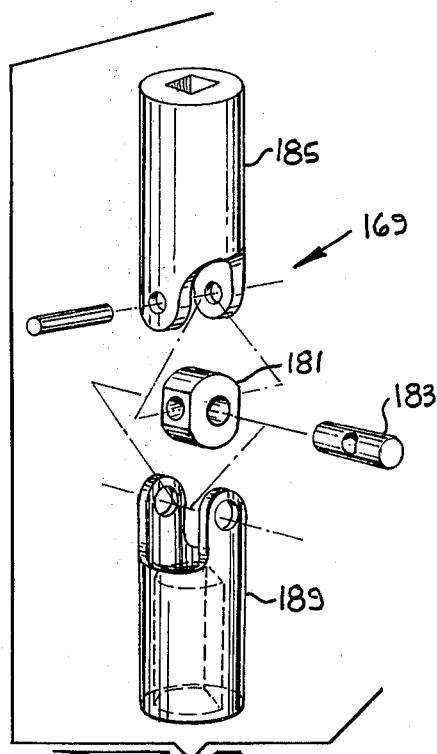

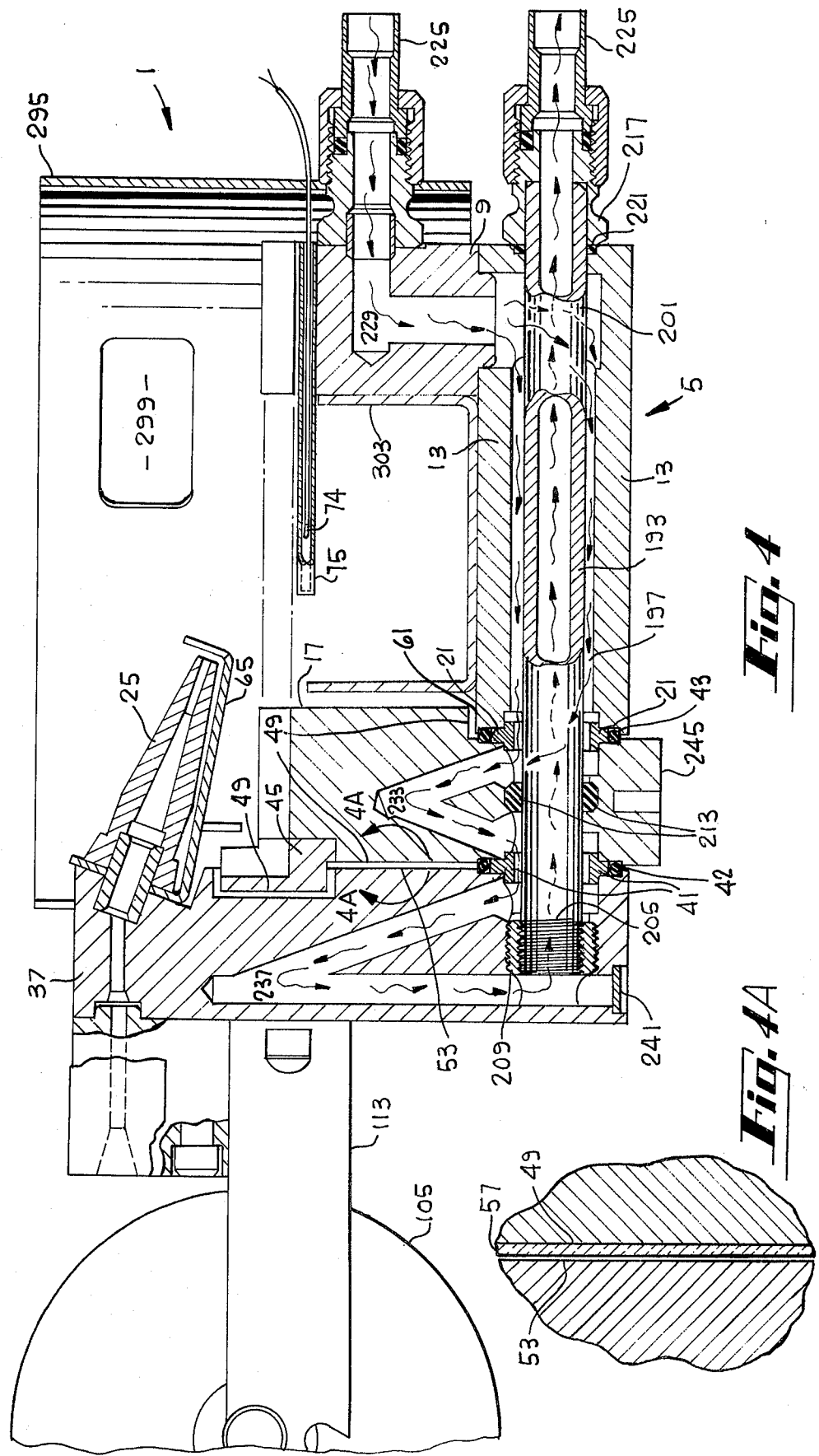

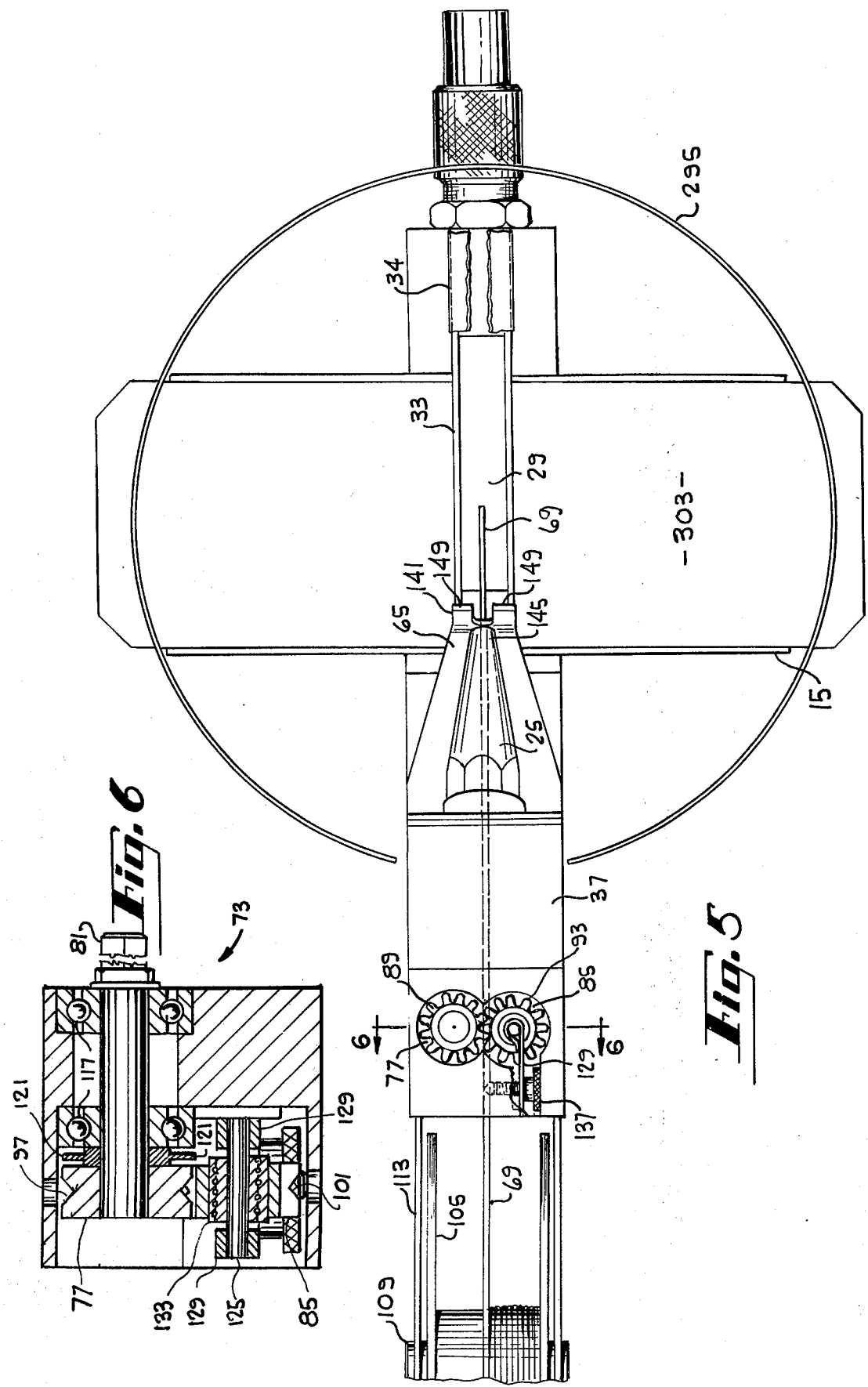

WIRE FED FLASH EVAPORATION SOURCE

BACKGROUND OF THE INVENTION

The invention is concerned with a novel and advantageous device for the flash evaporation of metal within a vacuum chamber whereby the metal is then deposited on a moving or stationary strip, on desired components, and the like.

A number of wire fed flash evaporation devices are known in the prior art. Each of these devices utilizes a pair of electrodes and a resistively heated boat which forms an electrical path between the two electrodes. A description of several such sources can be found in "Vacuum Technology" Research/Development, Feb. 1974, pp. 51 et seq.

While cooling of the electrodes or the bus bars to which the electrodes are often attached is well-known in the art to prevent localized melting and evaporation it has been usual in order to prevent shorting through coolant pipes to use separate coolant streams for each of the electrodes. This, of course, generally requires the introduction and exiting of at least two coolant streams into the vacuum chamber, one for each electrode, thus increasing the chances of leaks. Further, this does not generally provide cooling of the wire feed nozzle and the support which holds it and this can be important in preventing premature melting of the wire adjacent or even within the nozzle. Still further, because of their design it is usually required that a good deal of skill be exercised in taking apart and reassembling the prior art flash evaporation sources for cleaning purposes.

The present invention provides a flash evaporation source which solves many of the problems of prior art sources, requires only a single coolant stream to be introduced into the vacuum chamber, and is easily disassembled for cleaning and easily reassembled. Further, the nozzle through which wire is fed and the support which holds this nozzle are themselves water-cooled so as to provide a more even evaporation of wire which is fed onto a resistively heated boat.

SUMMARY OF THE INVENTION

The device of the invention is positionable within a shell usually comprising a base plate and a bell jar which forms a vacuum chamber and is useful for flash evaporating a material, most usually a metal, within the vacuum chamber. The device comprises a first electrode adapted to be grounded to the shell, a second non-grounded electrode positioned away from the grounded electrode, the second non-grounded electrode being connected to a power supply and a resistively heated boat in electrical contact with the grounded electrode and with the non-grounded electrode. A support is included adjacent the boat. A nozzle which communicates with the support is positioned to feed a wire comprising said material onto a flash evaporation portion of the boat. Means are provided which communicate with the nozzle for impelling the wire therethrough. Means are provided for fastening the grounded electrode, the non-grounded electrode and the support in spaced-apart relationship from one another. Means are also provided for flowing a single stream of coolant into contact with each of the grounded electrode, the non-grounded electrode and the support.

BRIEF DESCRIPTION OF THE DRAWINGS

FIG. 1 illustrates in perspective one embodiment of the flash evaporation device of the present invention.

FIG. 2 illustrates a section taken along plane 2—2 of FIG. 1.

FIG. 3 illustrates in detail a universal joint which forms a part of the embodiment illustrated in FIG. 1.

FIG. 4 illustrates in side section view an embodiment of the means for flowing a single stream of coolant through the flash evaporation device of the present invention. Also illustrated in some detail is the nozzle through which wire is fed onto the flash evaporation device.

FIG. 4A illustrates a detail in the area 4A—4A of FIG. 4.

FIG. 5 is a top view illustrating a detail in the wire feed mechanism of the preferred embodiment of the present invention.

FIG. 6 is a section view taken along lines 6—6 of FIG. 5.

DETAILED DESCRIPTION OF THE PREFERRED EMBODIMENT

Figure 7:
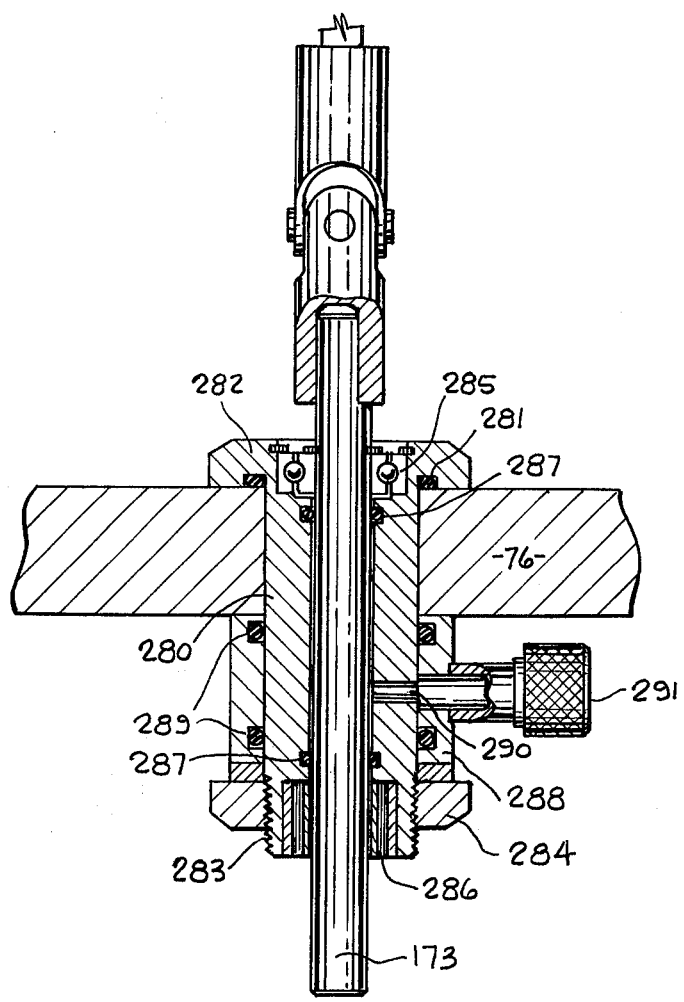
FIG. 7 is a section view taken along plane 7—7 of FIG. 1.

Referring to the drawings wherein like numbers denote like parts throughout, there is illustrated a particular embodiment of the device for flash evaporating a material within a vacuum chamber, said device being generally referred to by the numeral 1.

The device includes a grounded electrode 5 which as is shown in FIG. 4 is for ease of construction preferably machined of the two parts 9 and 13. In spaced-apart relationship from the grounded electrode is a non-grounded electrode 17. Insulation of the non-grounded electrode 17 from the grounded electrode 5 is provided by the insulator-separator 21.

A nozzle 25 is held adjacent a flash evaporation portion 29 of a resistively heatable boat 33. The boat is positioned between the grounded electrode 5 and the non-grounded electrode 17 by wrapping some graphite cloth 34 about each end thereof and then wedging the wrapped ends of the boat into recesses atop the electrodes. The nozzle is held by a support 37. The support is positioned adjacent and electrically insulated from the non-grounded electrodes 17 by an insulator-separator 41. O Rings 42 and 43 provide vacuum seal. Attached to the top of the non-grounded electrode is an extension thereof 45 which serves to shield the area between the non-grounded electrode and the support from accululating dirt and in particular from accumulating material which might be evaporated from the resistively heated boat. A surface 49 of the non-grounded electrode and its extension is provided with a ceramic facing 57. The ceramic facing insures that if any dirt is inadvertently trapped between the surfaces 49 and 53 or 49 and 61 this dirt will not cause a short between the support and the electrodes. FIG. 4A illustrates the facing in detail.

It should be noted that the nozzle 25 is in thermal contact with the support 37 as is a nozzle shield 65. Generally the support, the nozzle, the shield, the non-grounded electrode 17 and the grounded electrode 5 are each made of highly conductive material, for example, copper, so that efficient cooling of these structures can be assured. When the nozzle and the shield are efficiently cooled, premature and uneven melting of a wire 60 as it leaves the nozzle is prevented. Thereby, relatively uniform melting of the wire in the boat 33 and consequently relatively uniform flash evaporation of material is assured. The use of copper is further desirable for the grounded electrode and the non-grounded electrode to insure adequate electrical properties.

A thermocouple 74 is located adjacent the bottom of the boat 33. The thermocouple is positioned within a tube 75 which passes through the part 9 of the grounded electrode 5. The leads of the thermocouple pass through a baseplate 76 which forms part of the shell of a vacuum chamber in vacuum-tight sealed relationship thereto and thence to conventional controls which are not illustrated, for the power supply, also not illustrated, which is connected to the non-grounded electrode 17 as previously described. Thus, the power supply can be controlled by the thermocouple controls to keep the boat at a desired temperature.

Referring most particularly to FIGS. 5 and 6 there is illustrated means 73 communicating with the nozzle 25 for impelling the wire 69 through the nozzle. The wire-impelling means includes a dentate gear 77 which is driven by a drive shaft 81 and a dentate gear 85 which is driven by teeth 89 of the dentate gear 77. Both the teeth 89 of the dentate gear 77 and teeth 93 of the dentate gear 85 include notches therein 97 and 101 respectively. The wire is forced forward by the action of the notches contacting it peripherally at four equally-spaced points as it leaves a reel 105. The reel is supported in a conventional manner by an axle 109 and a casing 113.

As can be seen from FIG. 6 the drive shaft 81 passes through a ball bearing assembly 117 to minimize frictional drag. A shield 121 protects the ball bearing assembly from material shavings falling off the wire 69. The dentate gear 85 is rotatably mounted upon an axle 125 which is held in place by a spring 129. A second set of ball bearings 133 allows gear 85 to rotate with low friction. The dentate gear 85 is biased to mesh with the dentate gear 77 by the spring as illustrated most clearly in FIG. 5. The tension in the spring is adjusted via a tension adjusting knob 137.

Cooling of the nozzle 25 is assured by the shield 65 which has one end thereof 141 which extends beyond a tip 145 of the nozzle. Since as previously mentioned the shield as well as the nozzle is in good thermal contact with the support 37, these parts are kept relatively cool. Thus, when the wire 69 proceeds from the tip of the nozzle it is kept relatively cool until it passes beyond the end of the nozzle shield. The end of the shield includes two walls 149 with a slot between them, the slot being in position to allow the wire to pass therethrough. Back splattering or flashing of material, usually a metal alloy or a pure metal, from the flash evaporation portion 29 of the boat 33 onto the tip of the nozzle is thereby minimized.

The wire feed assembly comprises the reel 105, the impelling means 73, the axle 109 and the casing 113. Means for driving the wire feed assembly is provided by a first insulated universal joint 161 which drives the drive shaft 81, a shaft 165 which communicates with the lower end of the universal joint 161 and which at its other end connects with a second insulated universal joint 169, the second insulated universal joint, and the shaft 173 which passes through the baseplate 76 in vacuum-tight and rotatable relationship thereto. To insure complete electrical insulation it is only necessary that at least one of the universal joints be insulated.

The grounded electrode 5 is supported by the baseplate 76 and is at the same grounded potential as is the baseplate. Support for the grounded electrode is provided by the leg 179 which at its upper end communicates with the part 13 of the grounded electrode and at the other end communicates via the bolt 180 with the baseplate.

The structure of the insulated universal joints 161 and 169 is important and unique. Referring to FIG. 3, the insulated universal joint is illustrated in some detail. All parts of the insulated universal joint except for the universal axle 181 and the pin 183 are made of normal metallic material such as stainless steel. The universal axle and the pin are made of insulating material such as, for example, teflon or nylon. This provides complete electrical insulation between, for example, an upper portion 185 and a lower portion 189 of the insulated universal joint 169 and assures that the joint is self-lubricating whereby use of lubricants is not needed. This is especially important within a vacuum chamber where degassing of lubricants can take some time each time the chamber is evacuated. Along with complete electrical insulation there is provided complete driving coupling of the upper portion and the lower portion of the insulated universal joints. The use of the two universal joints 161 and 169 greatly minimizes alignment problems when the device 1 is attached to the baseplate 76.

Referring most particularly to FIG. 4 there is illustrated a means for flowing a single stream of coolant into contact with each of the grounded electrode 5, the non-grounded electrode 17 and the support 37, while maintaining said grounded electrode, said non-grounded electrode and said support electrically insulated from one another. In the preferred embodiment this means comprises a unique and useful combination of a tube 193 in spaced relationship to the walls of a tunnel 197, the tunnel passing through the grounded electrode, the non-grounded electrode and the support.

The one end 201 of the tube 193 is supported by the grounded electrode 5 and more particular by the portion 13 thereof. The other end 205 of the tube is supported by an insulator 209, said insulator being threaded both internally and externally, the internal threads thereof contacting mating threads at said other end of the tube and the exterior threading of said insulator contacting the support 37. As illustrated in FIG. 4, the tube is held in position whereby a single stream of coolant can flow between the interior of the tube adjacent the other end thereof and the space between the walls of the tunnel 197 and the exterior of the tube. The flow path illustrated by the arrows in FIG. 4 shows the coolant stream flowing inwardly to cool the grounded electrode, the non-grounded electrode 17 and the support by flowing around the exterior of the tube and the coolant stream then being removed after it passes through the interior of the tube. It is, of course, understood that the direction of flow is completely arbitrary and can be reversed.

The insulator-separator 213 serves to keep the tube 193 from contacting the non-grounded electrode 17 so that shorting out cannot occur through the tube. The one end of the tube extends beyond the grounded electrode 5 and is threaded to receive a nut 217. As will be obvious, tightening of the nut serves to force the support 37 as tightly as possible up against the non-grounded electrode and likewise to force the non-grounded electrode as close as possible up against the grounded electrode. The insulator-separators 21 and 41 keep actual contact from taking place. Thus, the nut and the insulator-separators serve as a means for fastening the grounded electrode, the non-grounded electrode and the support in spaced apart relationship from one another. An O-ring 221 is used to assure a tight leak-proof fit of the nut against the grounded electrode.

Water carrying pipes 225 as shown in FIG. 4 proceed into the vacuum chamber through the baseplate 76. Since the pipes are at the same potential as the grounded electrode 5, which is also at the same potential as the baseplate, the pipes can be made to pass through the baseplate and care does not have to be taken to insure that they do not touch the baseplate.

A passage 229 is provided through the grounded electrode 5 so as to provide more complete contact of the coolant with the electrode. Similarly a passage 233 is provided through the non-grounded electrode 17 and a passage 237 is provided through the support 37. The passage 229, 233 and 237 can be easily drilled into the respective members thus simplifying machining. A simple stopper 241 is provided to cap off the passage 237. The pipes 225 are attached adjacent the grounded electrode in the usual manner with commercial tube fittings as illustrated in FIG. 4.

A bottom portion 245 of the non-grounded electrode 17 is tapped to receive a conductor 251. The conductor is fastened by a bolt 255 into a post 259. As illustrated most clearly in FIG. 2, the post 259 passes through the baseplate 76 and is kept from contacting the baseplate by an insulative collar 263, an O-ring 267 and an insulative washer 271. The post 259 is held in place by tightening a nut 275 onto one end 279 of the post 259. Thus, a vacuum-tight seal is obtained between the post 259 and the baseplate while electrical contact between the post and the baseplate is completely prevented. The one end of the post 259 is then externally connected to a power supply. The ground of the power supply corresponds to the ground of the baseplate whereby when the power supply is operated current can pass only from the non-grounded electrode to the grounded electrode 5 via the boat 33.

Referring now to FIG. 7, there is illustrated in some detail the structure by which the shaft 173 passes through the baseplate 76 in vacuum-tight and rotatable relationship thereto. A plug 280 passes through a hole in the baseplate 76. A vacuum tight seal is provided between the plug and the baseplate by the O-ring 281 in the head 282 of the plug. The end 283 of the plug is threaded to receive the nut 284. Within the head of the plug is the ball bearing assembly 285 and within the end of the plug is the needle bearing assembly 286. The shaft 173 passes through the plug lengthwise in rotatable fit. A pair of O-rings 287 provide a vacuum tight seal of the shaft to the base of the plug. The collar 288 is positioned around the plug intermediate the nut and the baseplate. A pair of O-rings 289 provide a vacuum tight seal of the collar to the plug. A hole 290 connects the space along the shaft between the O-rings 287 with a tube fitting 291. In use, a vacuum is maintained between the O-rings 287 by attaching the fitting to a suitable vacuum pump. This serves to greatly reduce the possibility of air leaks past the O-rings 287 and into the vacuum chamber.

Referring now to FIGS. 1, 4 and 5, there are illustrated several other important features of the invention. In particular, a deposition shield 295 having a plurality of windows 299 therein is shown surrounding the boat 33. The deposition shield assures that metal vaporized from the boat does not completely coat the inside of a typical metal vacuum chamber bell jar which would fit over the entire device 1 in vacuum-sealed relationship to the baseplate 76. The windows serve to allow an operator of the flash evaporation apparatus to observe the apparatus in operation. A catch pan 303 serves to prevent dust, dirt and the like from becoming entrapped between the grounded electrode 5, the non-grounded electrode 17 and the support 37. A screen 311 in the baseplate serves as a path whereby gases can be evacuated from the vacuum chamber above said baseplate. The screen also serves to prevent particular matter from being carried into the conventional vacuum pumping apparatus which communicates therewith.

Any non-conductive coolant can be flowed through the coolant flowing means previously described. Generally, tap water is used because of its ready availability and low cost.

It should be noted that the entire vacuum deposition apparatus can be taken apart for cleaning by simply unscrewing the nut 217 and sliding the grounded electrode 5 and the non-grounded electrode 17 out over the tube 193. Alignment of these components on reassembly is automatic due to the use of the insulator-separators 41, 21 and 213.

OPERATION OF THE DEVICE

The operation of the device 1 of the present invention is relatively straightforward. The device is attached above the baseplate 76 of a vacuum chamber and an appropriate hood is placed over the device in vacuum-tight sealed relationship to the baseplate. The resulting vacuum chamber is then evacuated via a pump which is located beneath the screen 311.

The wire 69 is impelled forward through the nozzle 25 and onto the flash evaporation portion 29 of the resistively heated boat 33. As the wire touches the evaporation portion of the boat it is evaporated away and the evaporated material proceeds upwardly, the deposition shield 295 preventing great quantities of the evaporating material from coating the lower portions of the vacuum chamber walls. Located above the boat are components, stationary or moving strips or the like, which are to be coated by the material evaporated from the boat. The amount of deposition on the components, strips or the like, is controlled by controlling the amount of wire which is fed into the boat.

Current from an external power supply is fed via the conductor 251 to the non-grounded electrode 17. The ground loop of the power supply is completed through the baseplate 76 and the grounded electrode 5.

The temperature of the boat 33 can be kept constant if desired by use of the thermocouple 74 which senses changes in the temperature of the boat 33 caused by evaporation of material therefrom.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essen- That which is claimed is:

1. A device for evaporating a material within a shell which forms a vacuum chamber and positionable above a baseplate portion of said shell, comprising:
   a first electrode grounded to said shell;
   a second non-grounded electrode positioned away from said grounded electrode and connected to a power supply;
   a resistive heating boat in electrical contact with said grounded electrode and with said non-grounded electrode;
   a support adjacent said boat and electrically insulated from said grounded and non-grounded electrodes;
   a nozzle communicating with said support and in position to feed a wire onto an evaporation portion of said boat;
   means communicating with said nozzle for impelling said wire therethrough;
   means for fastening said grounded electrode, said non-grounded electrode and said support in spaced apart relationship from one another; and
   means for flowing a single stream of coolant into contact with each of said grounded electrode, said non-grounded electrode and said support.

2. A device as in claim 1, including a lead connecting said non-grounded electrode to said power supply, said lead passing through a hole in said shell without electrically contacting said shell, said lead being in vacuum-tight sealed relationship to said shell.

3. A device as in claim 2, including means for driving said wire impelling means, said driving means passing through said shell without electrically contacting it and being in vacuum-tight sealed relationship thereto.

4. A device for evaporating a material within a shell which forms a vacuum chamber and positionable above a baseplate portion of said shell, comprising:
   a first electrode adapted to be grounded to said shell;
   a second non-grounded electrode positioned away from said grounded electrode and connected to a power supply;
   a resistive heating boat in electrical contact with said grounded electrode and with said non-grounded electrode;
   a support adjacent said boat;
   a nozzle communicating with said support and in position to feed a wire onto an evaporation portion of said boat;
   means communicating with said nozzle for impelling said wire therethrough;
   means for fastening said grounded electrode, said non-grounded electrode and said support in spaced apart
   a tube within a tunnel in spaced relationship to the walls of the tunnel, the tunnel passing into said grounded electrode, said non-grounded electrode and said support, one end of said tube being supported by said grounded electrode and the other end of said tube being supported in position whereby said single stream of coolant can flow between the interior of said tube adjacent said other end thereof and the space between the walls of the tunnel and the exterior of the tube by insulator means which engage said tube adjacent said other end thereof and which also engage said support.

5. A device as in claim 4, wherein said fastening means includes a nut adapted to engage said one end of said tube.

6. A device as in claim 5, wherein said flowing means further includes a second insulator means separating said non-grounded electrode from said tube intermediate the ends of said tube.

7. A device as in claim 6, wherein said flowing means further includes a passage through said grounded electrode communicating at one end with the walls of the tunnel and at the other end with the surface of said grounded electrode.

8. A device as in claim 7, including a pair of pipes adapted to carry said single stream of coolant to and away from said grounded electrode, one of said pipes being in flow communication with said other end of said passage and the other of said pipes being in flow communication with the interior of said tube adjacent said one end thereof, both of said pipes passing through said shell in vacuum-tight sealed relationship thereto.

9. A device as in claim 8, including adjacent the mouth of said nozzle and attached to said support a heat shield adapted to allow passage of the wire therethrough, said shield being in heat conduction relationship to said support whereby the temperature of said nozzle is moderated.

10. A device as in claim 3, wherein said driving means comprises a first shaft passing through said shell in vacuum-tight and rotatable relationship thereto, a first universal joint at one end of said shaft, a second shaft one end thereof motivated by said first universal joint, a second universal joint at the other end of said second shaft, and a drive shaft motivated by said second universal joint, at least one of said universal joints having a universal axle and pin thereof made of an insulating and self-lubricating material whereby electric current is prevented from passing to said first shaft.

11. A device as in claim 1, wherein said resistive heating boat is in electrical contact with said grounded electrode and with said non-grounded electrode adjacent where said single stream of coolant contacts each of said grounded electrode and said non-grounded electrode.

* * * * *